United States Patent
Shin et al.

(10) Patent No.: US 7,123,406 B2
(45) Date of Patent: Oct. 17, 2006

(54) REFLECTIVE SEMICONDUCTOR OPTICAL AMPLIFIER LIGHT SOURCE

(75) Inventors: Dong-Jae Shin, Suwon-si (KR); Jeong-Seok Lee, Anyang-si (KR); Seung-Woo Kim, Seoul (KR); Seong-Taek Hwang, Pyeongtaek-si (KR)

(73) Assignee: Samsung Electronics Co Ltd., Suwon-Si (KR)

( * ) Notice: Subject to any disclaimer, the term of this patent is extended or adjusted under 35 U.S.C. 154(b) by 0 days.

(21) Appl. No.: 10/867,035

(22) Filed: Jun. 14, 2004

(65) Prior Publication Data

US 2005/0105171 A1 May 19, 2005

(30) Foreign Application Priority Data

Nov. 18, 2003 (KR) ............. 10-2003-0081474

(51) Int. Cl.
*H10S 5/50* (2006.01)
(52) U.S. Cl. ............................................. 359/344
(58) Field of Classification Search ........ 398/182, 398/183, 184, 201, 192, 195, 196, 197; 359/344
See application file for complete search history.

(56) References Cited

U.S. PATENT DOCUMENTS

| | | | | |
|---|---|---|---|---|
| 5,272,560 A | * | 12/1993 | Baney et al. ............... | 359/249 |
| 5,361,161 A | * | 11/1994 | Baney et al. ............... | 359/337 |
| 5,894,488 A | * | 4/1999 | Gaiffe et al. ................ | 372/6 |
| 5,986,790 A | * | 11/1999 | Ota et al. ................... | 398/1 |
| 6,195,200 B1 | * | 2/2001 | DeMarco et al. ........ | 359/337.21 |
| 6,215,809 B1 | * | 4/2001 | Ziari et al. ................. | 372/96 |
| 6,658,189 B1 | * | 12/2003 | Ajima et al. ............... | 385/123 |
| 6,900,885 B1 | * | 5/2005 | Masuda et al. ............ | 356/147 |
| 2002/0131695 A1 | * | 9/2002 | Masuda et al. ............ | 385/27 |
| 2005/0105169 A1 | * | 5/2005 | Hwang et al. ........... | 359/341.1 |

OTHER PUBLICATIONS

Coherence Length, Revision as of: 15:51, Feb. 25, 2002, Wikipedia.org.*
Coherence Length, Revision as of: 15:51, Jul. 18, 2002, Wikipedia.org.*
Ahn, J.T. et al., Double-path erbium-doped fiber amplifier with enhanced noise characteristics, Optical Society of America, Post-conference edition. TOPS vol. 39 Conference date: May 7-12, 2000.*

* cited by examiner

*Primary Examiner*—Jack Keith
*Assistant Examiner*—Ari M. Diacou
(74) *Attorney, Agent, or Firm*—Cha & Reiter, LLC

(57) ABSTRACT

A reflective semiconductor optical amplifier light source is disclosed. The reflective semiconductor optical amplifier light source includes a transmissive type semiconductor optical amplifier for creating and amplifying spontaneous emission light, a reflector for reflecting amplified spontaneous emission light outputted from the semiconductor optical amplifier such that amplified spontaneous emission light is reflected back into the semiconductor optical amplifier, and a bandpass filter having a predetermined wavelength band width for limiting wavelength bands of the amplified spontaneous emission light capable of passing through the bandpass filter. In one aspect of the invention, the bandpass filter is interposed between the semiconductor optical amplifier and the reflector. In another aspect, a polarization filter is imposed to limit the reflected emission light to a predetermined polarization.

6 Claims, 4 Drawing Sheets

REFLECTIVE SEMICONDUCTOR OPTICAL AMPLIFIER LIGHT SOURCE

CLAIM OF PRIORITY

This application claims priority, pursuant to 35 U.S.C. §119, to that patent application entitled "Reflective Semiconductor Optical Amplifier Light Source," filed in the Korean Intellectual Property Office on Nov. 18, 2003 and assigned Ser. No. 2003-81474, the contents of which are hereby incorporated by reference.

BACKGROUND OF THE INVENTION

1. Field of the Invention

The present invention relates to a light source, and more particularly to a broadband light source for outputting Amplified Spontaneous Emission (ASE) light.

2. Description of the Related Art

Erbium-doped fiber amplifier light sources, super luminescent diodes, and reflective semiconductor optical amplifier light sources have been suggested as broadband light sources for outputting incoherent light through wide wavelength bands. Although the erbium-doped fiber amplifier light sources produce stable high-power polarization-insensitive light, the produced wavelength band is limited so that the erbium-doped fiber amplifier light sources are unsuitable for the broadband light sources. In addition, the size of the erbium-doped fiber amplifier light sources is larger than the size of semiconductor devices and it is further difficult to reduce the manufacturing cost even if the erbium-doped fiber amplifier light sources are mass-produced. Super Luminescent Diodes (SLDs), on the other hand, have a large optical bandwidth and can be manufactured at a low cost. However, SLDs have a problem in that the output power is limited. Reflective Semiconductor Optical Amplifier (RSOA) light sources output spontaneous emission light that has been amplified by a highly reflective coating layer deposited on a first terminal or end of a Semiconductor Optical Amplifier (SOA). Thus, it is possible to achieve high-power broadband light sources at a low cost with RSOAs. However, if reflectivity of a second terminal of the semiconductor optical amplifier is not extremely low, a Fabry-Perot resonator is formed between the first and second terminals so that the spectrum of output light varies based on the wavelength of the output light. This variation is referred to as a "gain ripple". Thus, it is difficult to obtain incoherent light having a uniform spectrum.

In order to solve the gain ripple problem of the reflective semiconductor optical amplifier light sources, another broadband light source has been suggested, in which an external broadband reflector is connected to the SOA and a high reflective coating layer is not deposited on the first terminal of the semiconductor optical amplifier.

FIG. 1 is a schematic view showing a structure of a conventional reflective semiconductor optical amplifier light source 100. The conventional reflective semiconductor optical amplifier light source 100 includes a semiconductor optical amplifier (SOA) 110 and an external reflector (R) 120, which are connected to each other through an optical waveguide 130.

The semiconductor optical amplifier 110 includes a gain medium 112 and first and second anti-reflective layers 114 and 116 coated on both side ends of the gain medium 112. Incoherent amplified spontaneous emission light 140 is outputted through the first and second anti-reflective layers 114 and 116.

The external reflector 120 is optically connected to the first anti-reflective layer 114 through optical waveguide 130 and is used to reflect back the incoherent amplified spontaneous emission light 140 outputted through the first anti-reflective layer 114, such that the incoherent amplified spontaneous emission light 140 emitted is returned into the semiconductor optical amplifier 110. The distance between the semiconductor optical amplifier 110 and the external reflector 120 is preset or predetermined such that the incoherent amplified spontaneous emission light 140 returns to the semiconductor optical amplifier 110 by traveling over a length referred to as the coherence length. Coherence length is well-known in the art and need not be explained in detail herein.

The structure shown in FIG. 1 has an advantage in that a reflectivity condition needed of the first and second anti-reflective layers 114 and 116 to achieve a small gain ripple is attenuated. Thus, as a small gain ripple is generated even if reflectivity of the first and second anti-reflective layers 114 and 116 is not extremely low, an anti-reflection coating for the first and second anti-reflective layers 114 and 116 is easily achieved.

However, the above-mentioned reflective semiconductor optical amplifier light source 100 has an output power level lower than that of the erbium-doped fiber amplifier light source, so that there is a need for increasing the output power of the reflective semiconductor optical amplifier light sources and to provide a reflective semiconductor optical amplifier light source having a higher output power.

SUMMARY OF THE INVENTION

A high-output RSOA light source is disclosed. The RSOA comprises a transmissive type semiconductor optical amplifier for creating and amplifying spontaneous emission light, a reflector for reflecting amplified spontaneous emission light outputted from the semiconductor optical amplifier such that amplified spontaneous emission light is reflected back into the semiconductor optical amplifier and a bandpass filter having a predetermined wavelength band width for limiting wavelength bands of the amplified spontaneous emission light capable of passing through the bandpass filter. In one aspect of the invention, the bandpass filter is interposed between the semiconductor optical amplifier and the reflector.

BRIEF DESCRIPTION OF THE DRAWINGS

The above features and advantages of the present invention will be more apparent from the following detailed description taken in conjunction with the accompanying drawings, in which.

DETAILED DESCRIPTION OF THE INVENTION

Figure 1:
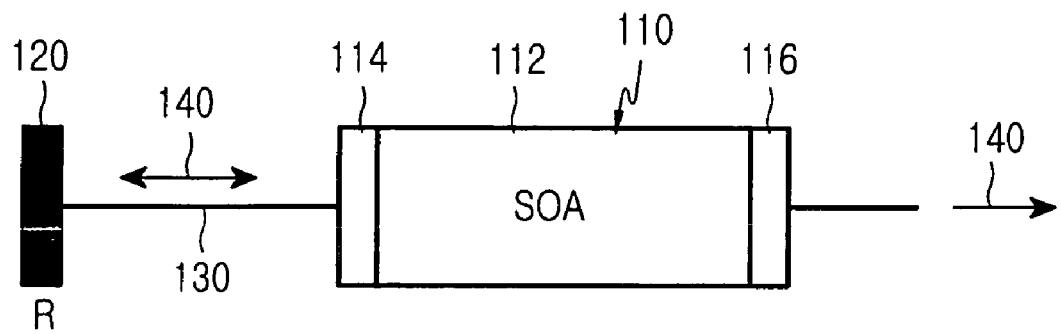
FIG. 1 is a schematic view showing a structure of a conventional reflective semiconductor optical amplifier light source.

Hereinafter, embodiments of the present invention will be described with reference to the accompanying drawings. In the following description of the present invention, the same reference numerals are used to designate the same or similar components. Furthermore, for the purpose of clarity and simplicity, a detailed description of known functions and configurations incorporated herein will be omitted when it may make the subject matter of the present invention unclear.

Figure 2:
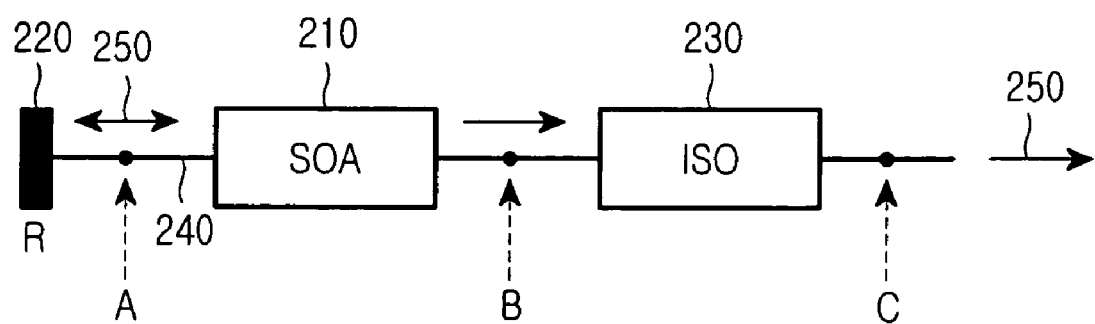
FIG. 2 is a schematic view for explaining the concept of a reflective semiconductor optical amplifier light source according to the principles of the present invention.
Figure 3:
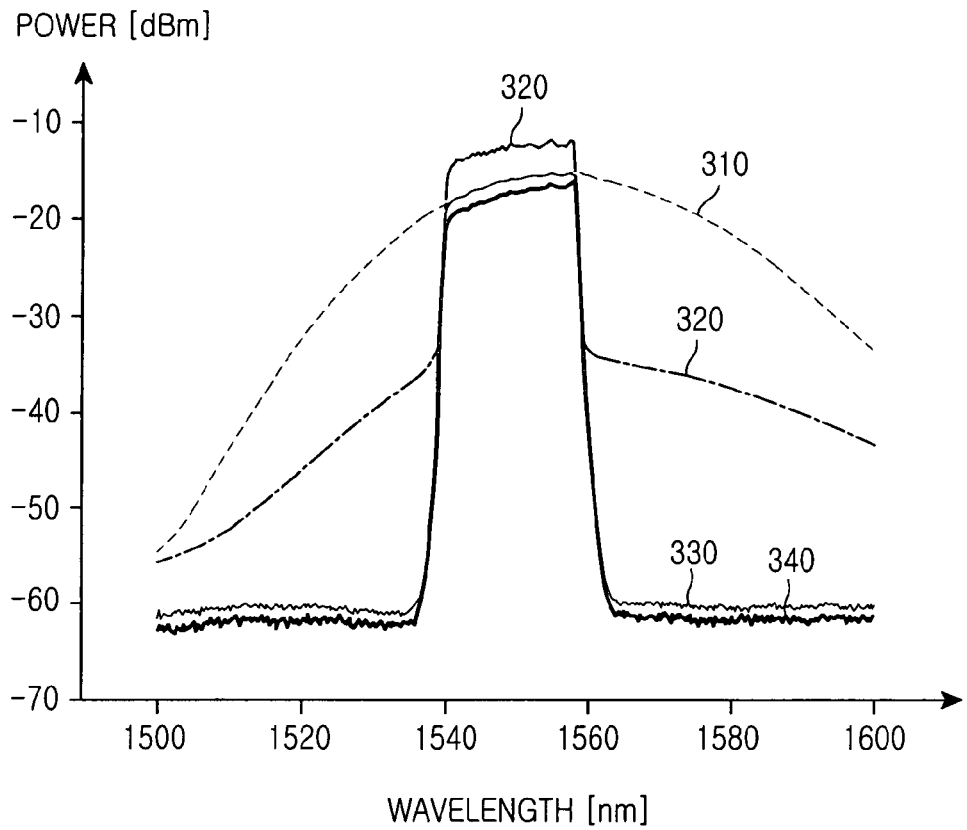
FIG. 3 is a graph showing various output power characteristics of a reflective semiconductor optical amplifier light source as a function of a position of a bandpass filter as referred to in FIG. 2.

FIG. 2 is a schematic view for explaining a concept of a reflective semiconductor optical amplifier light source 200 according to the principles of the present invention, and FIG. 3 represents a graph illustrating the output power characteristics of the reflective semiconductor optical amplifier light source 200 as a function of a position of a bandpass filter (BPF) included therein.

The reflective semiconductor optical amplifier light source 200, shown in FIG. 2, includes a transmissive type semiconductor optical amplifier (SOA) 210, a reflector (R) 220, and an optical isolator (ISO) 230. The optical isolator 230 is located at an output terminal of the reflective semiconductor optical amplifier light source 200 in order to reduce a gain ripple phenomenon caused by light incident into the reflective semiconductor optical amplifier light source 200 from an exterior source.

FIG. 3 illustrates a first output power spectrum 310 achieved when a bandpass filter is not added to the reflective semiconductor optical amplifier light source 200 (first case), a second output power spectrum 320 achieved when the bandpass filter is imposed at a position shown and referred to as "A" in FIG. 2, (second case), a third output power spectrum 330 achieved when the bandpass filter is imposed at a position shown and referred to as "B" in FIG. 2 (third case), and a fourth output power spectrum 340 achieved when the bandpass filter is imposed at a position shown and referred to as "C" in FIG. 2 (fourth case).

In the first case, the first output power spectrum 310 is determined based on a gain curve of the semiconductor optical amplifier 210 and has an uneven distribution through a wide wavelength bands In the second case, second output power spectrum 320 is distributed within a pass band of the bandpass filter and has a output power magnitude larger than a output power magnitude of the first output power spectrum 310. In the third case, the third output power spectrum 330 has a reduced output as compared with the output power magnitude of the first output power spectrum 310 due to an insertion loss of the bandpass filter. And, in the fourth case, the fourth output power spectrum 340 has a output power magnitude similar to the magnitude of the first output power spectrum 310 within the pass bandwidth of the bandpass filter. This is because a reflection is created by the bandpass filter so that output power magnitude is increased within the pass band width of the bandpass filter.

The increased output power magnitude is saturated corresponding to the magnitude of the first output power spectrum 310 due to output saturation of the semiconductor optical amplifier 210. As illustrated the position of the bandpass filter, shown and referred to as position A (second case) provides the greatest increase in the output. This is because a spectrum of amplified spontaneous emission light 250, which is reflected from the reflector 220 back to the semiconductor optical amplifier 210 is limited within the pass bandwidth of the bandpass filter, so the output power within the pass bandwidth of the bandpass filter is selectively increased. That is, since the output power out of the pass band width of the bandpass filter is reduced, the output power in the pass band width of the bandpass filter is relatively increased. In addition, a distribution of the spectrum in the pass band width of the bandpass filter depends on a spectrum characteristic of the bandpass filter as well as the gain curve of the semiconductor optical amplifier 210, so it is possible to uniformly distribute the second output power spectrum 320 by adjusting the spectrum characteristic of the bandpass filter. Embodiments of the present invention are now described with regard to the placement of an appropriate bandpass filter in the optical path between the SOA 210 and reflector 220, at the position referred to as position "A".

Figure 4:
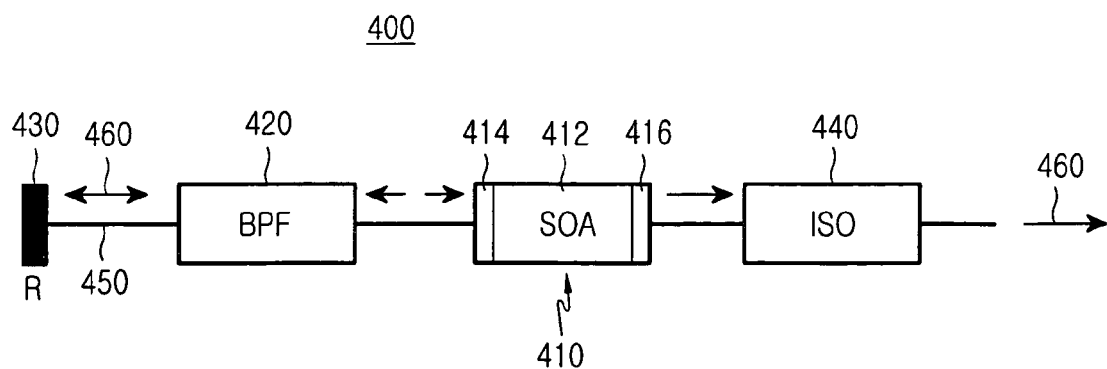
FIG. 4 is a schematic view showing a structure of a reflective semiconductor optical amplifier light source according to a first embodiment of the present invention.

FIG. 4 is a schematic view showing a structure of a reflective semiconductor optical amplifier light source 400 according to a first embodiment of the present invention. The reflective semiconductor optical amplifier light source 400 includes a semiconductor optical amplifier 410, a bandpass filter 420, a reflector 430, and an optical isolator 440.

The semiconductor optical amplifier 410 has a gain medium 412 and first and second anti-reflective layers 414 and 416 coated on both side ends of the gain medium 412, as previously described. Incoherent amplified spontaneous emission light 460 is outputted through the first and second anti-reflective layers 414 and 416. The reflector 430 is optically connected to the first anti-reflective layer 414, via optical medium 150, which reflects the incoherent amplified spontaneous emission light 460, back into the semiconductor optical amplifier 410. As discussed previously, the distance between the semiconductor optical amplifier 410 and the reflector 430 is preset to be a coherence length.

The bandpass filter 420 is imposed in the optical path between the semiconductor optical amplifier 410 and the reflector 430 and has a predetermined pass bandwidth for limiting wavelength bands of the incoherent amplified spontaneous emission light 460. A distribution of the output power spectrum of the reflective semiconductor optical amplifier light source 400 may be adjusted by controlling a spectrum characteristic of the bandpass filter 420.

The optical isolator 440 is located at an output terminal of the reflective semiconductor optical amplifier light source 400 in order to prevent the gain ripple phenomenon caused by light incident into the reflective semiconductor optical amplifier light source 400 from an exterior source.

Figure 5:
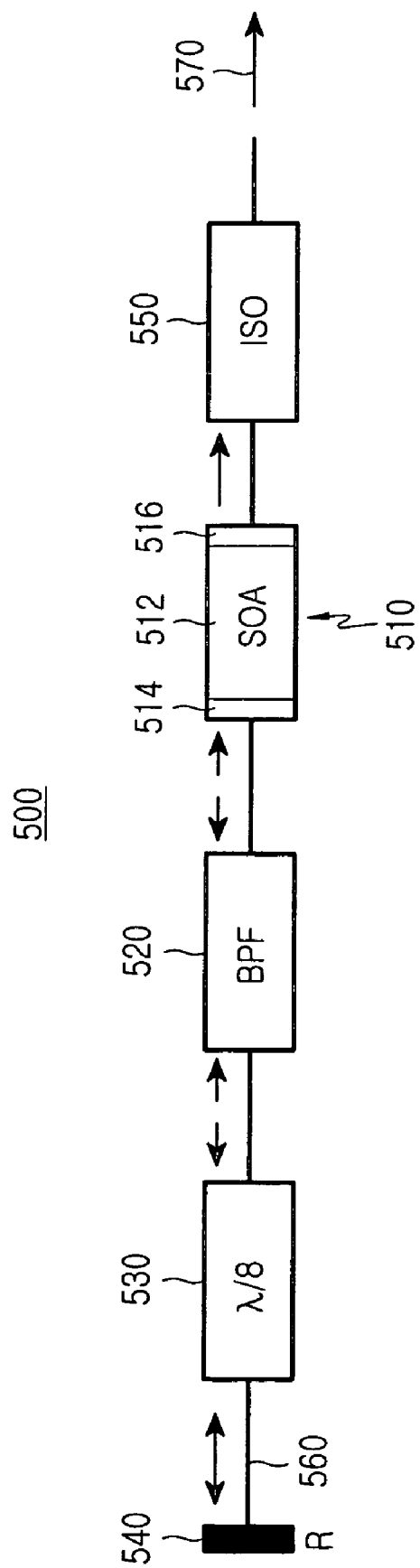
FIG. 5 is a schematic view showing a structure of a reflective semiconductor optical amplifier light source according to a second embodiment of the present invention.

FIG. 5 is a schematic view showing a structure of a reflective semiconductor optical amplifier light source 500 according to a second embodiment of the present invention. The reflective semiconductor optical amplifier light source 500 includes a semiconductor optical amplifier 510 having a gain medium 512 and first and second anti-reflective layers 514 and 516 coated at both side ends of the gain medium 512, a reflector 540, a bandpass filter 520, a 45° polarization rotator ($\lambda/8$) 530, and an optical isolator 550. The reflective semiconductor optical amplifier light source 500 is similar to the reflective semiconductor optical amplifier light source 400 shown in FIG. 4, with the inclusion of the 45° polarization rotator 530 located between the reflector 540 and the bandpass filter 520. Hence, only the 45° polarization rotator 530 needed be explained in detail to understand the embodiment shown in FIG. 5.

In this exemplary embodiment, 45° polarization rotator 530 is provided to improve the polarization characteristic of the reflective semiconductor optical amplifier light source 500, such that the semiconductor optical amplifier 510 gain varies based on the polarization state of the reflected light. In addition, the reflective semiconductor optical amplifier light source 500 outputs amplified spontaneous emission light 570 having a random polarization state due to the 45° polarization rotator 530. The amplified spontaneous emission light 570 outputted from the bandpass filter 520 passes through the 45° polarization rotator 530 twice by means of the reflector 540 so that a polarization direction of the amplified spontaneous emission light 570 is rotated at a right angle (90 degrees) from an initial polarization direction. In this 90 degree rotated state, the amplified spontaneous emission light 570 is inputted into the semiconductor optical amplifier 510.

Figure 6:
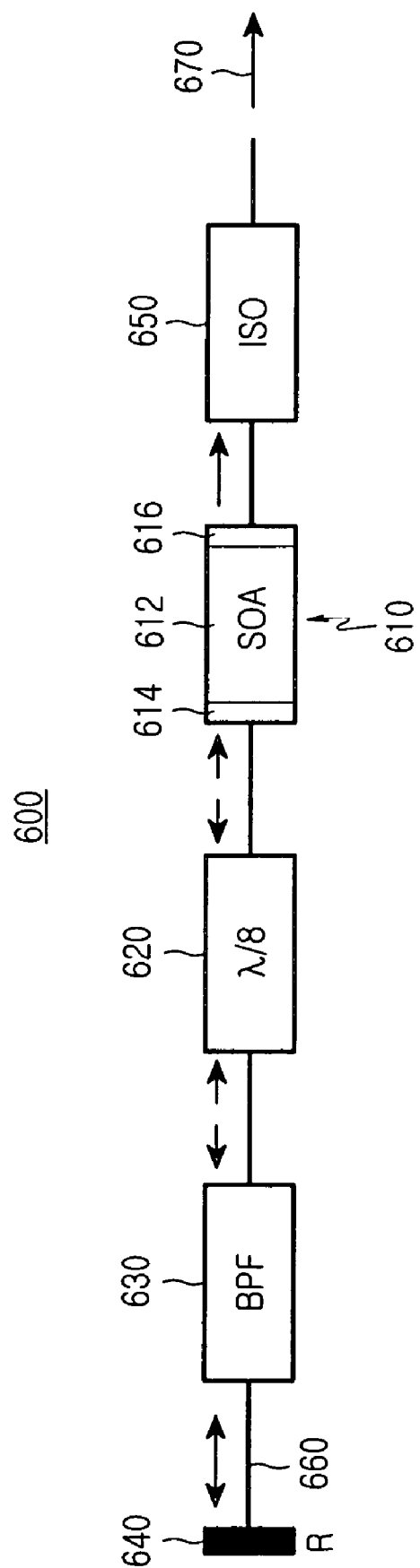
FIG. 6 is a schematic view showing a structure of a reflective semiconductor optical amplifier light source according to a third embodiment of the present invention.

FIG. 6 is a schematic view showing a structure of a reflective semiconductor optical amplifier light source 600 according to a third embodiment of the present invention. The reflective semiconductor optical amplifier light source 600 includes a semiconductor optical amplifier 610 having a gain medium 612 and first and second anti-reflective layers 614 and 616 coated at both side ends of the gain medium 612, a reflector 640, a bandpass filter 630, a 45° polarization rotator (λ/8) 620, and an optical isolator 650. The reflective semiconductor optical amplifier light source 600 is similar to the reflective semiconductor optical amplifier light source 500 shown in FIG. 5, except that the 45° polarization rotator 620 is located between the semiconductor optical amplifier 610 and the bandpass filter 630. Again, only the operation of the 45° polarization rotator 620 in this position need be discussed to understand the operation of the embodiment shown in FIG. 6.

In this exemplary embodiment, amplified spontaneous emission light 670 outputted from the semiconductor optical amplifier 610 passes through the 45° polarization rotator 620 twice by means of the reflector 640 so that a polarization direction of the amplified spontaneous emission light 670 is rotated at a right angle from an initial polarization direction thereof. In this rotated state, the amplified spontaneous emission light 670 is reflected back into the semiconductor optical amplifier 610.

While the present invention has been shown and described with reference to certain preferred embodiments thereof, it will be understood by those skilled in the art that various changes in form and details may be made therein without departing from the spirit and scope of the invention as defined by the appended claims.

What is claimed is:

1. A reflective semiconductor optical amplifier light source comprising:
    a transmissive semiconductor optical amplifier configured to create and amplify spontaneous emission light;
    a reflector configured to reflect amplified spontaneous emission light outputted from the semiconductor optical amplifier such that the amplified spontaneous emission light is reflected back to the semiconductor optical amplifier; and
    a bandpass filter interposed between the semiconductor optical amplifier and the reflector, the band pass filter being configured to have a predetermined wavelength band width and to limit the amplified spontaneous emission that is reflected back to the semiconductor optical amplifier to an amplified spontaneous emission light capable of passing through the bandpass filter.

2. The reflective semiconductor optical amplifier light source as claimed in claim 1, further comprising:
    a polarization rotator located between the semiconductor optical amplifier and the bandpass filter, the rotator configured to provide a predetermined polarization of the amplified spontaneous emission light passing therethrough.

3. The reflective semiconductor optical amplifier light source as claimed in claim 2, wherein the predetermined polarization is 45 degrees.

4. The reflective semiconductor optical amplifier light source as claimed in claim 1, further comprising:
    an optical isolator configured to isolate light incident into the reflective semiconductor optical amplifier light source from an exterior source.

5. The reflective semiconductor optical amplifier light source as claimed in claim 1, further comprising:
    a polarization rotator located between the reflector and the bandpass filter, the polarization rotator configured to provide a predetermined polarization of the amplified spontaneous emission light passing therethrough.

6. The reflective semiconductor optical amplifier light source as claimed in claim 5, wherein the predetermined polarization is 45 degrees.

* * * * *